United States Patent
Sikes et al.

(10) Patent No.: US 6,249,841 B1
(45) Date of Patent: Jun. 19, 2001

(54) INTEGRATED CIRCUIT MEMORY DEVICE AND METHOD INCORPORATING FLASH AND FERROELECTRIC RANDOM ACCESS MEMORY ARRAYS

(75) Inventors: L. David Sikes; Michael Alwais, both of Colorado Springs; Donald G. Carrigan, Monument, all of CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 09/205,538

(22) Filed: Dec. 3, 1998

(51) Int. Cl.$^7$ .................................................. G11C 11/12
(52) U.S. Cl. .................. 711/107; 711/103; 711/104; 257/296; 257/298; 365/63
(58) Field of Search ................................. 257/296, 298; 365/63; 711/101, 104, 105, 107

(56) References Cited

U.S. PATENT DOCUMENTS

| | | | |
|---|---|---|---|
| 5,442,210 | * | 8/1995 | Kanehachi .............................. 257/296 |
| 5,838,603 | * | 11/1998 | Mori et al. ............................... 365/63 |
| 5,998,828 | * | 12/1999 | Ueno et al. ............................ 257/315 |
| 6,015,984 | * | 1/2000 | Leu ........................................ 257/298 |
| 6,055,655 | * | 4/2000 | Momohara ............................ 714/723 |
| 6,150,724 | * | 11/2000 | Wenzel et al. ........................ 257/777 |

OTHER PUBLICATIONS

Haiping et al., 'Fabrication & Testing of Integrated Ferroelectric Capacitors', IEEE, 9/98 pp. 63–66.*

Philofsky et al., 'FRAME—The Ultimate Memory', IEEE, 4/96 pp. 99–104.*

"Different Approaches to Flash Memory Technology", http://ise.eng.uts.edu.au/ise/hyptech/miniprj/mnprj97a/tank_lin/ap_flsh.htm, Nov. 5, 1998.

"Boot Block Flash Memory Technology", TN–28–01, Micron Technology, Inc., 1966.

"Atmel Introduces 16 Megabit Concurrentflash Read–While–Write Flash Devices", pp. 2–4, hhtp://www.atmel-.com/atmel/news/19981102.html, Atmel Corporation, on or before Nov. 5, 1988.

* cited by examiner

Primary Examiner—Reba I. Elmore
(74) Attorney, Agent, or Firm—William J. Kubida; Hogan & Hartson, LLP

(57) ABSTRACT

An integrated circuit memory device and method incorporating Flash and ferroelectric random access memory arrays integrated on a common substrate. The present invention allows a relatively small amount of ferroelectric random access memory to mitigate many of the erase and write time disadvantages exhibited by current Flash technology devices. In particular, whether combined together as a single stand-alone memory device or embedded together as a portion of a processor, microcontroller or application specific integrated circuit ("ASIC"), a block of ferroelectric memory that is sized to match the largest sector of Flash memory can effectively compensate for the latter's slow erasure and write times.

21 Claims, 4 Drawing Sheets

PROCESSOR WITH 4MB FLASH/FERROELECTRIC MEMORY

US 6,249,841 B1

INTEGRATED CIRCUIT MEMORY DEVICE AND METHOD INCORPORATING FLASH AND FERROELECTRIC RANDOM ACCESS MEMORY ARRAYS

CROSS REFERENCE TO RELATED PATENT APPLICATIONS

The present invention is related to the subject matter disclosed in U.S. patent application Ser. No. 09/021,132 filed Feb. 10, 1998 for: "Integrated Circuit Memory Device Incorporating a Non-Volatile Memory Array and a Relatively Faster Access Time Memory Cache", assigned to Ramtron International Corporation, Colorado Springs, Colorado, assignee of the present invention, the disclosure of which is herein specifically incorporated by this reference.

BACKGROUND OF THE INVENTION

The present invention relates, in general, to the field of integrated circuit ("IC") memory devices. More particularly, the present invention relates to an integrated circuit memory device employing multiple non-volatile memory technologies integrated on a common substrate, specifically, Flash and ferroelectric random access memory cells and wherein certain of the disadvantages inherent in the former are ameliorated by its combination with the latter.

Various types of non-volatile memory devices are currently available, by means of which data can be retained without the necessity of a continuously applied power source. These include, for example, erasable programmable read only memory ("EPROM") devices, including electrically erasable ("EEPROM") devices, and Flash memory. Flash memory cells are generally similar in construction to that of an EPROM cell with the exception that they incorporate a relatively shallower gate oxide thickness of on the order of 10–20 nanometers (to allow Fowler-Nordheim electron tunneling) and the fact that erase operations must be done either in blocks or over the entire memory chip at once. Functionally, the contents of Flash, EPROM and EEPROM memory devices must all be erased prior to being written with new data.

The confluence of its relatively low cost and programmability features has established Flash memory as the currently dominant non-volatile memory technology. With a comparatively small memory cell structure and the capability of field programmability, it is generally superior to the other floating gate technologies from which it is derived. Nevertheless, programming (or writing) Flash memory is particularly difficult and time consuming resulting in a relatively slow access time, particularly with respect to "write" operations.

As mentioned previously, a Flash memory device must be erased prior to writing and to this end, recent devices have partitioned the memory array into sectors such that only a portion of the memory need be erased to write to a given sector. This then allows the user to read other portions of the memory after one sector is erased, with erasure of a typical Flash memory sector requiring between one and fifteen seconds. During this time period, it is difficult to access a Flash memory so still other Flash memory devices now allow the erase process to be momentarily interrupted to perform a "read" operation. Nevertheless, no current devices will permit a "write" during the erase cycle.

Still another disadvantage of Flash memories is that they are relatively slow to program. That is, even after erasure, a byte of Flash memory typically requires between 9 and 300 microseconds to program. For example, a 4Mb Flash memory device divided into sectors may exhibit a maximum sector size of 512 Kb or 64 Kbytes. The programming time for an entire sector would then require somewhere between 576 and 19.2K microseconds. While the programming of a Flash memory is still relatively faster than its preceding erase cycle, it is still very slow in terms of central processing unit ("CPU") speed and hinders overall system input/output ("I/O") performance.

In contrast to Flash memory technology, ferroelectric memory devices, such as the FRAME® (a registered trademark of Ramtron International Corporation, Colorado Springs, Colorado) family of solid state, random access memory integrated circuits provide non-volatile data storage through the use of a ferroelectric dielectric material which may be polarized in one direction or another in order to store a binary value. The ferroelectric effect allows for the retention of a stable polarization in the absence of an applied electric field due to the alignment of internal dipoles within the Perovskite crystals in the dielectric material. This alignment may be selectively achieved by application of an electric field which exceeds the coercive field of the material. Conversely, reversal of the applied field reverses the internal dipoles.

Data stored in a ferroelectric memory cell is "read" by applying an electric field to the cell capacitor. If the field is applied in a direction to switch the internal dipoles, more charge will be moved than if the dipoles are not reversed. As a result, sense amplifiers can measure the charge applied to the cell bit lines and produce wither a logic "1" or "0" at the IC output pins. In a conventional two transistor/two capacitor ("2C/2T") ferroelectric memory cell, (one transistor/one capacitor "1T/1C" devices have also been described) a pair of two data storage elements are utilized, each polarized in opposite directions. To "read" the state of a 2T/2C memory cell, both elements are polarized in the same direction and the sense amps measure the difference 10 between the amount of charge transferred from the cells to a pair of complementary bit lines. In either case, since a "read" to a ferroelectric memory is a destructive operation, the correct data is then restored to the cell during a precharge operation.

In a simple "write" operation, an electric field is applied to the cell capacitor to polarize it to the desired state. Briefly, the conventional write mechanism for a 2T/2C memory cell includes inverting the dipoles on one cell capacitor and holding the electrode, or plate, to a positive potential greater than the coercive voltage for a nominal 100 nanosecond ("nsec.") time period. The electrode is then brought back to circuit ground for the other cell capacitor to be written for an additional nominal 100 nsec.

As can be seen, ferroelectric memory technology is vastly superior to Flash memory in terms of its programming time and device complexity. However, Flash memory has a current market penetration that ferroelectric technology has not yet achieved.

SUMMARY OF THE INVENTION

The device and method of the present invention advantageously discloses the combination of both Flash and ferroelectric memory technologies on a common substrate in a manner that allows a relatively small amount of ferroelectric random access memory to mitigate many of the disadvantages exhibited by current Flash technology devices. In particular, whether combined together as a single standalone memory device or embedded together as a portion of a processor, microcontroller or application specific integrated circuit ("ASIC") a block of ferroelectric memory that is sized to match the largest individually erasable sector of Flash memory can effectively compensate for the latter's slow erasure and write times.

The utility of the present invention is exemplified by a representative 4Mb Flash memory device with a maximum sector size of 512 Kb which may be integrated with a 512 Kb block of ferroelectric memory. Depending on the particular application intended, various combinations of hardware and software may then be utilized to dynamically map the ferroelectric memory block to any erased sector of the Flash memory array. Particular advantages inure by combining the Flash and ferroelectric memories on a common substrate with the provision of the requisite interface circuitry to enable automatic operation.

Particularly disclosed herein is an integrated circuit memory device comprising a non-volatile memory block comprising at least one memory sector and a ferroelectric memory block integrated on a common substrate with the non-volatile memory block, the ferroelectric memory block being configured to maintain data intended to be written to the at least one memory sector while an erase operation is performed thereon.

Also disclosed herein is an integrated circuit device comprising a processor; a non-volatile memory block integrated on a common substrate with the processor, the non-volatile memory block comprising at least one memory sector; and a ferroelectric memory block integrated on a common substrate with the processor and the non-volatile memory block, the ferroelectric memory block being configured to maintain data intended to be written to the at least one memory sector while an erase operation is performed thereon.

Still further disclosed herein is a method for writing to an integrated circuit device incorporating a non-volatile memory block and a ferroelectric memory block integrated on a common substrate therewith. The method comprises the steps of: maintaining data intended to be written to at least one memory sector of the non-volatile memory block in the ferroelectric memory block; erasing the contents of the memory sector; and transferring the data maintained in the ferroelectric memory block to the memory sector of said non-volatile memory block following the operation of erasing.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
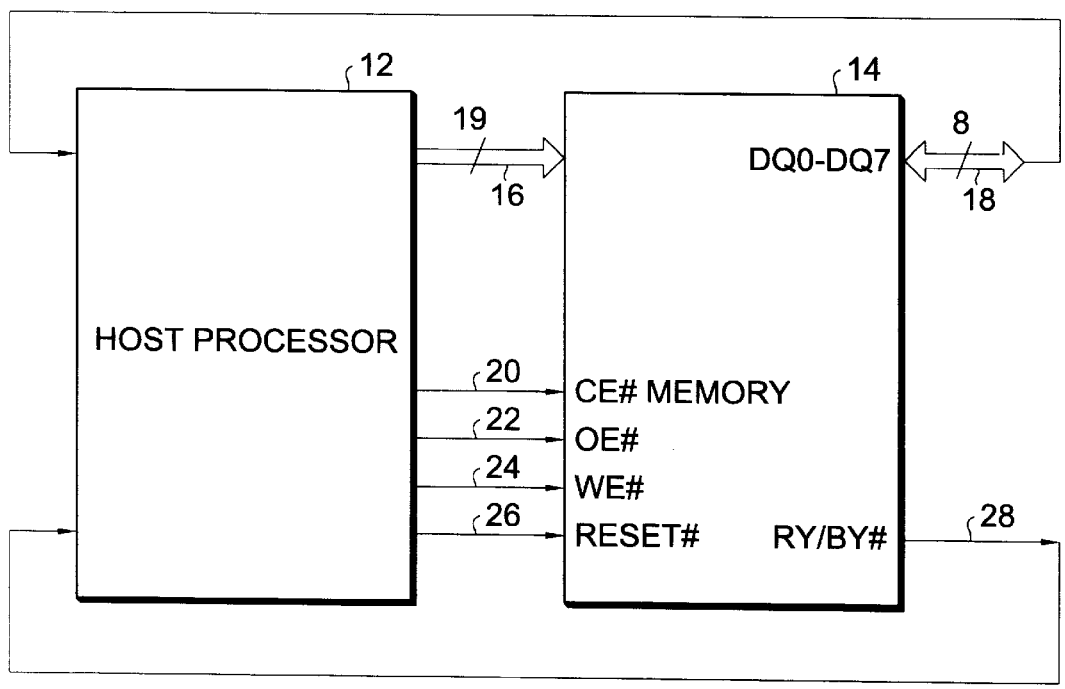
FIG. 1 illustrates a representative computer system comprising a host processor and integrated Flash/ferroelectric memory device in accordance with one embodiment of the present invention.

With reference now to FIG. 1, a simplified computer system 10 is illustrated comprising a host processor 12 and an associated integrated circuit memory device 14 incorporating Flash and ferroelectric memory arrays in accordance with the present invention. The memory device 14 is addressed by the host processor 12 by, for purposes of example only, a nineteen line address bus 16. The memory device 14 further comprises an eight bit bi-directional data bus ("DQ0–DQ7") on which includes data to be written to read from the memory device 14 is presented. The host processor 12 provides a chip enable ("CE#") input 20, output enable ("OE#") input 22, write enable ("WE#") input 24 and reset ("RESET#") input 26 to the memory device 14. In turn, the memory device 14 provides a ready/busy ("RY/BY#") input 28 to the host processor 12.

The computer system 10 illustrated is of a configuration similar to that utilized with respect to a conventional Flash memory device, but the performance is significantly enhanced by the inclusion of a block of ferroelectric memory equal in size to the largest Flash memory sector. In the embodiment illustrated, the ferroelectric memory block functions as a write buffer, allowing the system to write data to the memory device 14 at ferroelectric random access memory device speeds.

Figure 2:
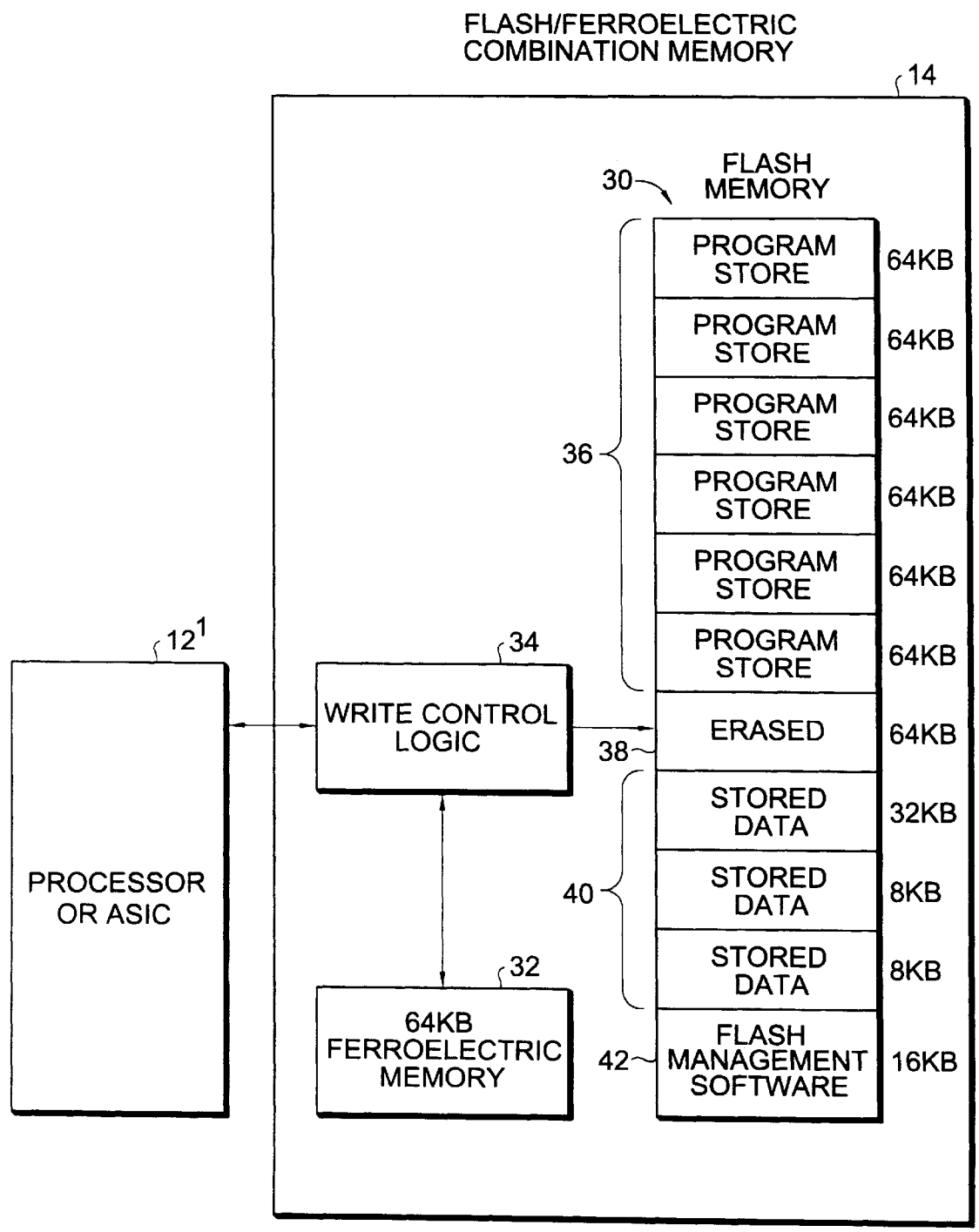
FIG. 2 illustrates an integrated circuit device in accordance with the present invention comprising a block of ferroelectric memory integrated on a common substrate with a Flash memory wherein the ferroelectric memory may be utilized by an associated microcontroller or ASIC to effectively reduce the delays inherent in the erasure of a block of the Flash memory.

With reference additionally now to FIG. 2, the memory device 14 is illustrated in greater detail at a moment in time in a computer system in which the host processor 12 (FIG. 1) is any form of processing device including ASIC type devices, such as processor or ASIC $12^1$, operatively coupled thereto as shown. The memory device 14 comprises a block of Flash memory 30 and a block of ferroelectric memory 32 which is sized to correspond to the largest sector (i.e. 64 KB) of the Flash memory 30. A write control logic block 34 operatively couples the ferroelectric memory 32 and the Flash memory 30 as will be more fully described hereinafter.

As one example, the Flash memory 30 includes a number of program store sectors 36, one or more erased sectors 40 (which vary from time to time), a number of stored data sectors 38 and a Flash management software sector 42 which, in the exemplary embodiment illustrated, may be sized relatively as shown.

The utility of the integrated circuit memory device 14 of the present invention is shown in this figure with respect to a Flash sector erasure operation. When the host processor (or microcontroller or ASIC $12^1$) issues a sector erase command, the combined Flash/ferroelectric integrated circuit memory device 14 initiates the erase process (i.e. sector 38) but also makes write access available to the ferroelectric memory block 32 at the corresponding addresses. For example, if the Flash memory block sector to be erased (i.e. sector 38) resides between addresses 40000h–4FFFFh, then any access to this area would be directed to the ferroelectric memory block 32. The microcontroller $12^1$ would perform writes to the ferroelectric memory block 32 before the sector 38 erasure is complete, in this manner, reducing the overall system delay due to the Flash memory 30 erase operation.

Read/write access to this memory sector 38 continues to be directed to the ferroelectric memory block 32 until another sector is erased. When the erase command is issued for a new sector, the contents of the ferroelectric memory block 32 must be written to the Flash memory 30 for permanent storage.

In this regard, there may be two potential implementations, with each accommodating this particular situation differently depending on the functionality of the write control logic 34. In the first instance, the single block of ferroelectric memory 32 must be copied into the Flash memory 30. At this time, one sector starts the erase process and a second sector is written with the contents of the ferroelectric memory as will be more fully described and shown hereinafter with respect to FIG. 3. The entire memory device 14 would be unavailable for writes until the Flash sector 38 was completely written, which may take as long as 19.2K microseconds using the example illustrated. Thus the presence of the ferroelectric memory block 32 has effectively masked the erase delay of the Flash memory 30 but not the write delay. In some implementations of the present invention, the sector write operation could be coordinated with other system activities to occur at a convenient time. During the transfer of ferroelectric memory block 32 data to the Flash memory 30, the memory organization would be substantially as shown.

Figure 3:
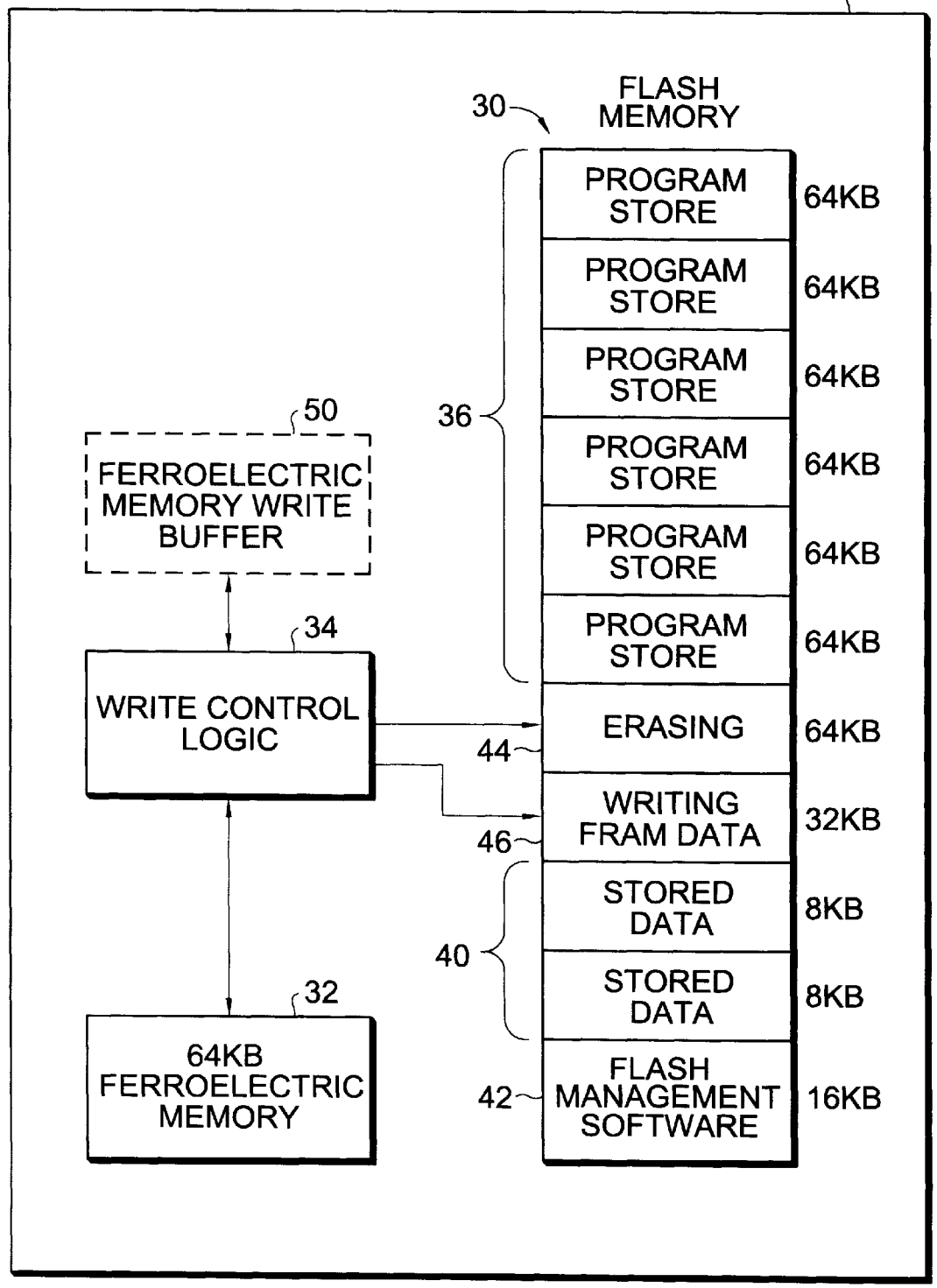
FIG. 3 illustrates the integrated circuit device of FIG. 2 during the transfer of data stored in the ferroelectric memory to the Flash memory and the possible inclusion of a second block of ferroelectric memory for purposes of masking the write delay time of the Flash memory.

With reference additionally now to FIG. 3, a further alternative implementation of a memory device 14 in accordance with the present invention is shown and wherein that structure previously described with respect to the preceding figures is like numbered and the foregoing description thereof shall suffice herefor. In this embodiment, the Flash memory 30 sector 44 is in the process of being erased while sector 46 is being written with data held in the ferroelectric memory block 32.

In this alternative implementation of the memory device 14, a second block of ferroelectric memory 50 (the ferroelectric memory write buffer shown in dashed lines) under control of the write control logic 34 may be included to accept writes during the time that the Flash memory sector 46 is being programmed. This then allows the ferroelectric memory 50 to mask the write delay of the Flash memory 30 as well. This additional ferroelectric memory block 50 may be sized to accept a few writes or an entire sector depending on design criteria and other system trade-offs. Considering the relative slowness of Flash memory 30 erase cycles and the speed with which ferroelectric memory 32, 50 can be written, it may not be possible to prevent the system from overrunning the buffering scheme under certain extreme operational conditions. Nevertheless, while the use of a second ferroelectric memory array 50 may not entirely mask the slowness of the Flash memory 30 in an unrestricted operational environment, it does enable reasonable design considerations to be used in mitigating most inherent Flash memory 30 delays.

Once the ferroelectric memory block 32 has been emptied and stored to the Flash memory 30, it is again available to be re-mapped in the address space as a new sector of Flash memory 30. In the embodiment illustrated utilizing more than one block of ferroelectric memory 32, 50, these memory blocks may be utilized in "ping-pong" fashion with one being transferred to Flash memory 30 while the other is being written with new data.

Figure 4:
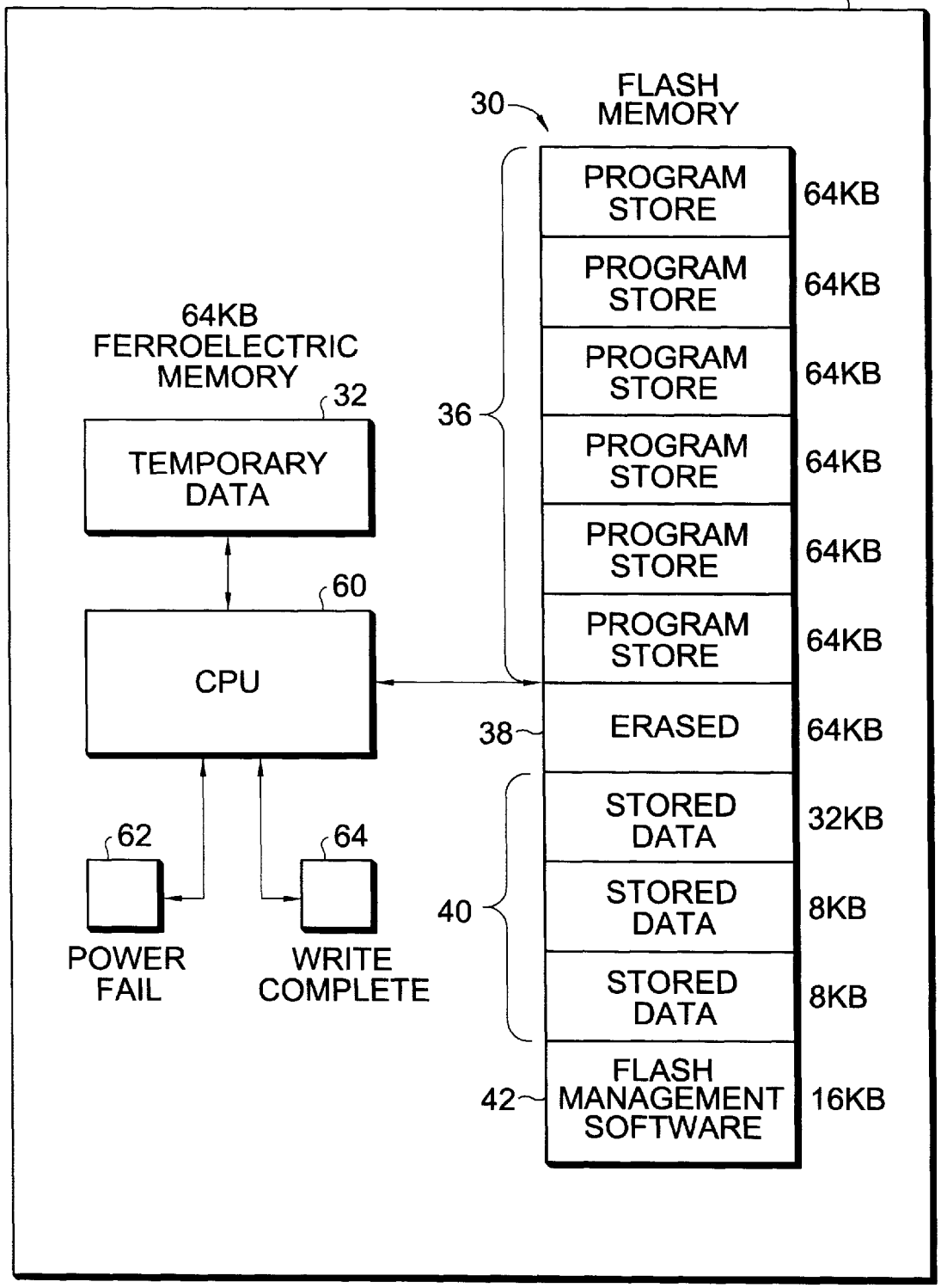
FIG. 4 illustrates an alternative embodiment of the combined Flash and ferroelectric memories of the present invention embedded as a portion of a processor, microcontroller or ASIC which manifests certain other advantages of the combined memory technologies.

With reference additionally now to FIG. 4, a combined Flash and ferroelectric integrated circuit device 54 of the present invention is illustrated as combining Flash memory 30 and a ferroelectric memory block 32 integrated (or embedded) with a processor ("CPU") 60, microcontroller or ASIC. Combining the benefits of the Flash and ferroelectric memory technologies as previously described with respect to memory device 14 (FIGS. 1–3) together with a processor 60 can actually provide additional benefits over and above that to be found its use as a standalone Flash/ferroelectric memory device. In this implementation, it should be noted that it is not necessary to make the ferroelectric memory block 32 operation effectively transparent to the processor 60. In fact, maximum benefit can be derived when the processor 60 manages both the Flash memory 30 and ferroelectric memory block 32 resources to suit the particular needs of a given application.

Among the benefits of this implementation are that:

1) data can be written to the ferroelectric memory block 32 and stored in Flash memory 30 under software control. This minimizes the impact of any delays and potentially reduces the quantity of ferroelectric memory 32 needed to mask the Flash memory 30 disadvantages;

2) software can manage data for conditions like power loss. For example, if power fails (as sensed on line 62) prior to completing a write to the Flash memory 30, the data still resides in the ferroelectric memory block 32. By utilizing the ferroelectric memory 32 in a flexible fashion, the system can keep a record of the Flash memory 30 sector that was being programmed. The system must be able to detect power loss and the fact that the Flash memory block write was incomplete, then re-write the Flash memory when power returns and signal completion of the write operation on line 64; and 3) One block of ferroelectric memory 32 can be used to buffer writes for portions of multiple Flash memory 30 sectors simultaneously. Rather than buffering writes to one sector in the ferroelectric memory 32 and transferring that sector completely to Flash memory 30, the system can store random data and program it to Flash memory 30 when convenient.

While there have been described above the principles of the present invention in conjunction with a specific memory technology having a relatively slow erase and write time, such as Flash memory, in conjunction with particular ferroelectric memory device architectures and embedded applications, it is to be clearly understood that the foregoing description is made only by way of example and not as a limitation to the scope of the invention and the principles of the present invention would likewise pertain to the integration of a block of EPROM or EEPROM memory together with a similar ferroelectric memory block. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit memory device comprising:
   a non-volatile memory block comprising at least one memory sector; and
   a ferroelectric memory block integrated on a common substrate with said non-volatile memory block.

2. The integrated circuit memory device of claim 1 wherein said ferroelectric memory block is configured to maintain data intended to be written to said at least one memory sector while an erase operation is performed thereon.

3. The integrated circuit memory device of claim 1 further comprising write control logic integrated on said common substrate for controlling an erase operation to said at least one memory sector of said non-volatile memory block and write operations to said ferroelectric memory block.

4. The integrated circuit memory device of claim 3 wherein said write control logic is further operative to control transfer of said data maintained within said ferroelectric memory block to said at least one memory sector of said non-volatile memory block following completion of said erase operation.

5. The integrated circuit memory device of claim 1 further comprising a ferroelectric memory write buffer configured to accept data intended for said at least one memory sector or another of said at least one memory sectors of said non-volatile memory block while said ferroelectric memory block maintains said data intended for said at least one memory sector of said non-volatile memory block.

6. The integrated circuit memory device of claim 1 wherein said non-volatile memory block comprises a programmable read only memory.

7. The integrated circuit memory device of claim 6 wherein said programmable read only memory is selected from a group comprising Flash, EPROM and EEPROM.

8. An integrated circuit device comprising:
   a processor;
   a non-volatile memory block integrated on a common substrate with said processor, said non-volatile memory block comprising at least one memory sector; and
   a ferroelectric memory block integrated on a common substrate with said processor and said non-volatile memory block, said ferroelectric memory block being configured to maintain data intended to be written to said at least one memory sector while an erase operation is performed thereon.

9. The integrated circuit device of claim 8 wherein said ferroelectric memory block is further configured to maintain said data intended to be written to said at least one memory sector following completion of said erase operation.

10. The integrated circuit device of claim 8 wherein said processor is operative for controlling an erase operation to said at least one memory sector of said non-volatile memory block and write operations to said ferroelectric memory block.

11. The integrated circuit device of claim 10 wherein said processor is further operative to control transfer of said data maintained within said ferroelectric memory block to said at least one memory sector of said non-volatile memory block following completion of said erase operation.

12. The integrated circuit device of claim 10 wherein peripheral logic is operative to control transfer of said data maintained within said ferroelectric memory block to said at least one memory sector of said non-volatile memory block following completion of said erase operation.

13. The integrated circuit device of claim 8 further comprising a ferroelectric memory write buffer configured to accept data intended for said at least one memory sector or another of said at least one memory sectors of said non-volatile memory block while said ferroelectric memory block maintains said data intended for said at least one memory sector of said non-volatile memory block.

14. The integrated circuit device of claim 8 wherein said non-volatile memory block comprises a programmable read only memory.

15. The integrated circuit device of claim 14 wherein said programmable read only memory is selected from a group comprising Flash, EPROM and EEPROM.

16. A method for writing to an integrated circuit device incorporating a non-volatile memory block and a ferroelectric memory block integrated on a common substrate therewith, said method comprising:
   maintaining data intended to be written to at least one memory sector of said non-volatile memory block in said ferroelectric memory block;
   erasing a contents of said at least one memory sector; and
   transferring said data maintained in said ferroelectric memory block to said at least one memory sector of said non-volatile memory block following said operation of erasing.

17. The method of claim 16 wherein said operations of maintaining, erasing and transferring are carried out by means of a write control logic block integrated on said common substrate.

18. The method of claim 16 wherein said operations of maintaining, erasing and transferring are carried out by means of a central processing unit integrated on said common substrate.

19. The method of claim 16 further comprising:
   also maintaining additional data intended to be written to another memory sector of said non-volatile memory block in an additional ferroelectric memory block while said ferroelectric memory block maintains said data intended for said at least one memory sector of said non-volatile memory block.

20. The method of claim 19 further comprising:
   writing said additional data maintained in said additional ferroelectric memory block to said another memory sector of said non-volatile memory block following said operation of transferring.

21. The method of claim 19 wherein said ferroelectric memory block and said additional ferroelectric memory block may be alternatively utilized in performing said operations of maintaining and also maintaining.

* * * * *